United States Patent
Shrader et al.

(10) Patent No.: US 7,062,625 B1
(45) Date of Patent: Jun. 13, 2006

(54) INPUT/OUTPUT CELLS FOR A DOUBLE DATA RATE (DDR) MEMORY CONTROLLER

(75) Inventors: Steven Shrader, Boise, ID (US); Art Gmurowski, Rochester, MI (US); Samitinjoy Pal, Fremont, CA (US); Michael McKeon, Cedar Park, TX (US)

(73) Assignee: Denali Software, Inc., Palo Alto, CA (US)

( * ) Notice: Subject to any disclaimer, the term of this patent is extended or adjusted under 35 U.S.C. 154(b) by 116 days.

(21) Appl. No.: 10/210,858

(22) Filed: Jul. 31, 2002

Related U.S. Application Data

(60) Provisional application No. 60/322,538, filed on Sep. 14, 2001.

(51) Int. Cl.
*G06F 12/00* (2006.01)
(52) U.S. Cl. .................... 711/167; 711/105
(58) Field of Classification Search ............ 711/104, 711/105, 106, 167, 168, 169, 154; 365/189.01, 365/189.02, 189.05; 713/400, 500, 501, 713/502, 503
See application file for complete search history.

(56) References Cited

U.S. PATENT DOCUMENTS

| | | | |
|---|---|---|---|
| 6,452,865 B1 * | 9/2002 | Wolford | 365/233 |
| 6,493,285 B1 * | 12/2002 | Wolford | 365/233 |
| 6,529,993 B1 * | 3/2003 | Rogers et al. | 711/105 |
| 6,571,308 B1 | 5/2003 | Reiss et al. | 710/315 |
| 6,593,575 B1 | 7/2003 | Fries | 250/363.03 |
| 6,665,230 B1 * | 12/2003 | Shrader et al. | 365/233 |
| 6,671,211 B1 * | 12/2003 | Borkenhagen et al. | 365/189.05 |

OTHER PUBLICATIONS

*DDR SDRAM Functionality and Controller Read Data Capture*, DesignLine, Micron Technology Inc. vol. 8, Issue 3, pp. 1-24 3Q99.

* cited by examiner

*Primary Examiner*—Brian R. Peugh
(74) *Attorney, Agent, or Firm*—Fenwick & West LLP

(57) ABSTRACT

An interface for sending write data, write control signals and write data between a memory controller and a double data rate (DDR) memory with the appropriate timing relationships so that the write data can be reliably written in the DDR memory. Also, an interface for reliably capturing read data received from the DDR memory during a read operation.

15 Claims, 19 Drawing Sheets

Pad driver

I/O Cell logic

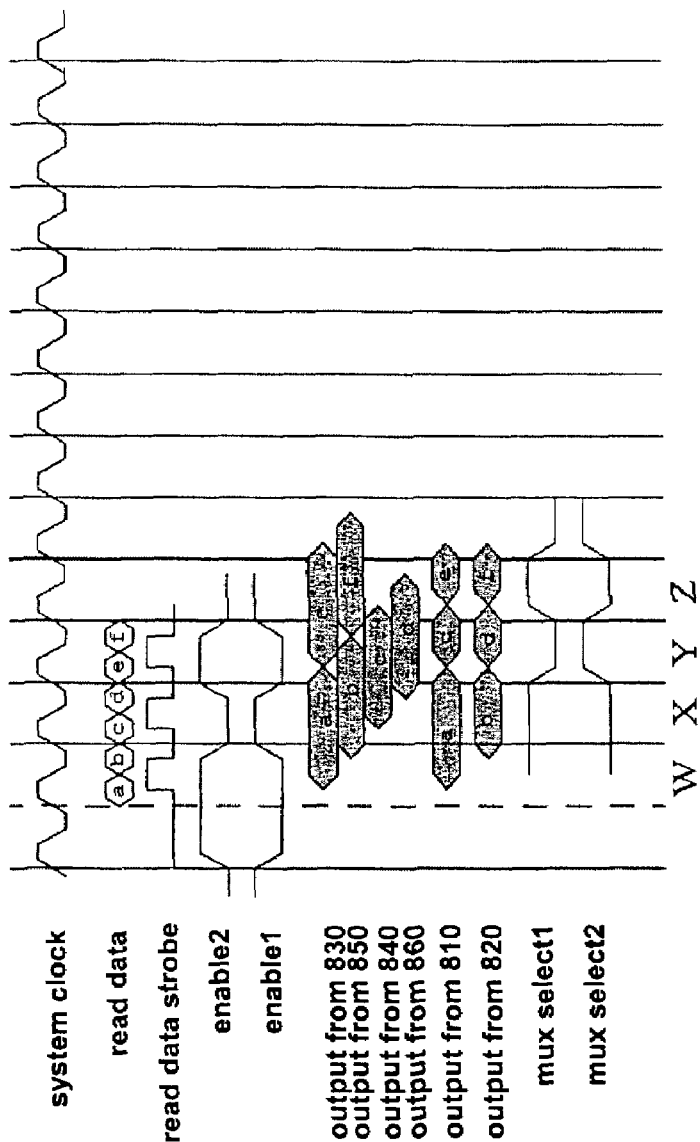

INPUT/OUTPUT CELLS FOR A DOUBLE DATA RATE (DDR) MEMORY CONTROLLER

RELATED APPLICATIONS

This application claims priority under 35 U.S.C. § 119(e) to U.S. Provisional Patent Application Ser. No. 60/322,538, "Delay Compensation Circuit for Capturing and Sending DDR Memory Device Data," by Steven Shrader, Art Gmurowski, Samitinjoy Pal and Michael McKeon, filed Sep. 14, 2001.

This application is related to co-pending U.S. patent application Ser. No. 10/211,691, now U.S. Pat. No. 6,665,230, entitled "Programmable Delay Compensation Circuit," by Steven Shrader, Art Gmurowski, Samitinjoy Pal and Michael McKeon, filed on Jul. 31, 2002, which is herein incorporated by reference.

BACKGROUND OF THE INVENTION

1. Field of the Invention

The present invention relates to memory devices and, more particularly, to writing data to and capturing data from Double Data Rate (DDR) memory devices.

2. Description of the Related Art

Double data rate (DDR) memory devices read and write data on both the positive and negative edges (transitions) of a clock signal. Thus, DDR memory provides twice the data rate of memory devices that only read and write data on the positive edge of a clock signal. Along with the increased bandwidth, a DDR memory substantially increases the complexity of the memory subsystem. Since two data words are now transferred every clock cycle as opposed to one in a single data rate device, the data eye, or window during which the data can reliably be captured, is significantly reduced. For example, FIG. 1A illustrates a clock signal and a data trace for a single data rate memory and a double data rate memory. As illustrated, the single data rate memory reads/writes one word per clock cycle while the double data rate device reads/writes two words per clock cycle. Thus, the data eye for data in a single data rate memory is much larger than the data eye for data from a double data rate memory. This aspect of the DDR design significantly increases the complexity of the timing considerations for reading and writing data to and from the DDR memory.

When data is written to a DDR memory, a write data strobe and the corresponding write data are sent to the DDR memory. The DDR memory uses the write data strobe to capture the write data so that it can be written to memory. The DDR memory assumes that the write data strobe is aligned with the data eye of the write data, therefore, the circuit interfacing with the DDR memory needs to output the write data strobe and the write data to the DDR memory with the appropriate timing relationship. The flight time for the write data and the associated write data strobe between the circuit and the DDR memory device should be equal to ensure proper timing when the signals reach the DDR memory.

To reduce complexity in the memory device, DDR memories typically require the write data strobe to arrive at the DDR memory within some percentage of the rising edge of the master clock for the DDR memory. For example, some DDR memory devices require the write data strobe to arrive at the DDR memory within ¼ of the rising edge of the DDR master clock. The write data strobe can be delayed to ensure that the write data strobe arrives at the DDR memory during the appropriate window. However, the amount of delay applied to the write data strobe depends on the distance the signal travels from the circuit to the DDR memory device. This distance is referred to as flight time. Since the flight time varies for different board designs, the DDR memory timing requirements require specialized circuitry to be developed for each new board design to ensure that the write data strobe and the write data arrive at the DDR memory with the appropriate timing relationship. This is inefficient and costly.

During a read operation, the circuit interfacing with the DDR memory receives read data along with a read data strobe from the DDR memory. As illustrated in FIG. 1B, the DDR memory sends the read data strobe coincident with the read data. In other words, the rising and falling edges 110 and 120 of the read data strobe occur when the read data is in transition. In order to reliably capture the read data, the read data strobe is delayed so that the rising and falling edges of the read data strobe are aligned with the data eye of the read data.

Since the read data strobe and the read data are coincident when sent from the DDR memory, it is assumed that the wires for the data and the associated read data strobe are routed with the same length between the DDR memory device and the receiving circuit. In other words, the receiving circuit assumes that the read data strobe and the read data are coincident when they are received. If they are not coincident, the delay applied by the circuit may not align the read data strobe with the center of the data eye of the read data. This may reduce the reliability of the read data capture.

The amount of delay applied to the read data strobe depends on the type of DDR memory device being used. The data eye during which the read data can be captured varies for different DDR memory devices. The relationship between the data strobe and the data sent from the DRAM devices is not always coincident. Each memory device may differ in the specification of this relationship. This can affect the optimum delay that should be applied to maximize the reliability of the data capture. Thus, the amount of delay that needs to be applied to the read data strobe varies for different DDR memory devices. Again, to meet these design requirements, the delay circuitry must often be redesigned for each type of DDR memory that is used in the memory subsystem.

Due to the high frequency nature of the double data rate transfers of data, what is needed are output cells positioned as close to the edge of the ASIC as possible to send data and control signals to the DDR memory. The output cells help to maintain the timing relationships between the data and corresponding control signals, thus increase the efficiency of writing data to the DDR memory.

What is also needed is a read data capture circuit that can be used to reliably capture read data.

SUMMARY OF THE INVENTION

The present invention describes I/O cells used to interface between a memory controller and a double data rate (DDR) memory. In one embodiment, the memory controller is part of an application specific integrated circuit (ASIC). The I/O cells are positioned close to the edge of the ASIC to help ensure that the control signals, data and clock signals are output with the appropriate timing relationship so that the DDR memory can reliably capture the write data.

A control output cell sends control signals from the memory controller to the DDR memory. Each control signal transferred from the memory controller to the DDR memory has its own control output cell. Similarly, a data mask output cell sends data mask bits from the controller to the DDR memory. Each data mask bit corresponds to a byte of data transferred to the DDR memory and is used by the DDR memory to determine if the byte of data is to be written into memory. Thus, the number of data mask output cells depends on the number of bytes in the data path between the memory controller and the DDR memory. Since DDR memories write data on both the positive and negative edge of a clock signal, each data mask output cell sends two data mask bits per clock cycle. The first data mask bit corresponds to a byte in the low word sent to the DDR memory and the second data mask bit corresponds to a byte in the high word sent to the DDR memory.

A data strobe I/O cell both sends and receives data strobes to and from the DDR memory. The data strobe I/O cell receives a read data strobe from the DDR memory during a read operation and passes the read data strobe to a delay circuit in a memory controller so that the read data strobe can be delayed to align with the data eye of the read data. During write operations, the data strobe I/O cell outputs a write data strobe to the DDR. The data strobe I/O cell outputs the write data strobe to the DDR memory aligned with the corresponding write data such that the rising and falling edges of the write data strobe align with the data eye of the write data.

Data I/O cells send and receive write and read data to and from the DDR memory. During a write operation, each data I/O cell sends two bits of write data to the DDR memory per clock cycle. The write data is output from the data I/O cell with the appropriate timing relationship with respect to the write data strobe, as described above. This increases the reliability of the write operation.

In another embodiment of the present invention, a read data capture cell is described that captures read data from a DDR memory during a read operation. The read data capture cell uses multiple flip flops to capture the read data on alternating clock cycles. As a result, the read data capture cell is capable of capturing read data that has up to one clock cycle of variation in the flight time between the memory and the read data capture cell. In addition, the read data capture cell can easily be scaled to handle greater potential variations in the flight time between the memory and the read data capture cell.

BRIEF DESCRIPTION OF THE DRAWINGS

FIGS. 9A–B are timing diagrams illustrating the earliest and latest arrival times of the read data.

DETAILED DESCRIPTION OF THE PREFERRED EMBODIMENTS

The present invention provides input/output (I/O) cells that interface between two asynchronous clocking domains. In a preferred embodiment, these I/O cells are used in conjunction with a memory controller that is part of an application specific integrated circuit (ASIC) to interface between the ASIC and a double data rate (DDR) DRAM memory. The memory controller and the I/O cells are used to increase the efficiency of data transfers by outputting the write data, write data strobe and other write commands to the DDR memory with the appropriate timing relationships such that the data can be reliably written to memory.

Figure 2A:
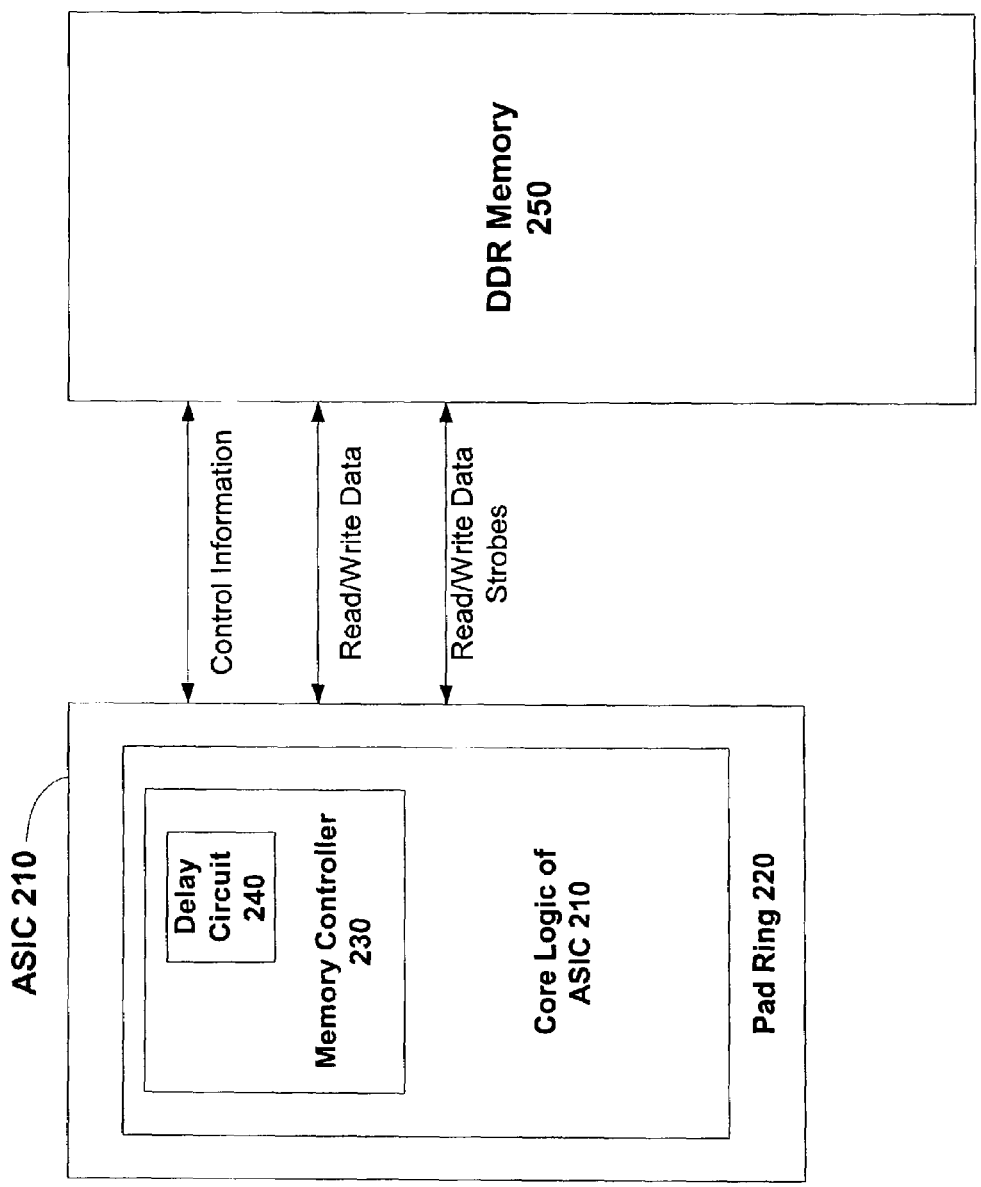
FIG. 2A is block diagram of an application specific integrated circuit (ASIC) coupled to a double data rate (DDR) memory.

FIG. 2A is a block diagram of an application specific integrated circuit (ASIC) 210 coupled to a DDR memory 250. As illustrated, ASIC 210 includes a pad ring 220, a memory controller 230 and the core logic of ASIC 210. Memory controller 230 further comprises delay circuit 240. In one embodiment, delay circuit 240 is a programmable delay compensation circuit (DCC) as described in co-pending application Ser. No. 10/211,691, now U.S. Pat. No. 6,665,230, entitled "Programmable Delay Compensation Circuit," by Steven Shrader, Art Gmurowski, Samitinjoy Pal and Michael McKeon.

During a write operation, ASIC 210 outputs write data to DDR memory 250 along with a write data strobe and other control signals needed by the DDR memory. The DDR memory uses the write data strobe to capture the write data so that it can be written to memory. In order to reliably capture the write data, DDR memories typically require the rising and falling edges of the write data strobe to align with the data eye of the write data. In addition, to reduce complexity in the memory device, DDR memories usually require the write data strobe to arrive at the DDR memory within some percentage of the rising edge of the master clock of the DDR memory. For example, some common DDR memory devices require the rising edge of the write data strobe to arrive at the DDR memory within ¼ of a clock cycle of the rising edge of the DDR master clock. Thus, the write data and write data strobe need to be output from ASIC 210 with the appropriate timing to ensure they arrive at the DDR memory within the correct window and with the appropriate timing relationship with respect to each other so that the DDR memory can reliably write the data to memory.

In one embodiment of the invention, the write data strobe is created in the memory controller from a system clock of the ASIC which has the same frequency as the master clock in the DDR memory. In this embodiment, the system clock is delayed in delay circuit 240 of memory controller 230 to create a write data strobe with the appropriate timing relationship with respect to the write data. In the embodiment of delay circuit 240 described in co-pending application Ser. No. 10/211,691, now U.S. Pat. No. 6,665,230, entitled "Programmable Delay Compensation Circuit," by Steven Shrader, Art Gmurowski, Samitinjoy Pal and Michael McKeon, the write data strobe is selected, based on a programmable delay value, from one of a plurality of delayed system clocks. In one embodiment, the plurality of system clocks are delayed in ¼ clock cycle intervals. This embodiment allows the designer of the circuit board to select the appropriate write data strobe based on the particular layout of the ASIC and the DDR memory being used in the design. The ability to select the delay using a programmable input allows the same memory controller circuitry to be used with varying board designs and memory devices.

Due to the high frequency nature of the data transfers between the ASIC and the DDR memory and the critical timing relationships that need to be maintained for the clock signals (i.e. write data strobes) sent from the ASIC to the DDR memory, the clock signals used by the memory controller and the DDR memory are de-skewed with respect to one another. In one embodiment of the invention, clock de-skew circuitry ensures that the rising edge of the system clock arrives at the memory controller at the same time that the rising edge of a clock output from the ASIC arrives at the DDR memory. One skilled in the art will recognize that there are many ways to implement the de-skew circuitry depending on whether the clock signal is generated on the ASIC or external to the ASIC.

Figure 2B:
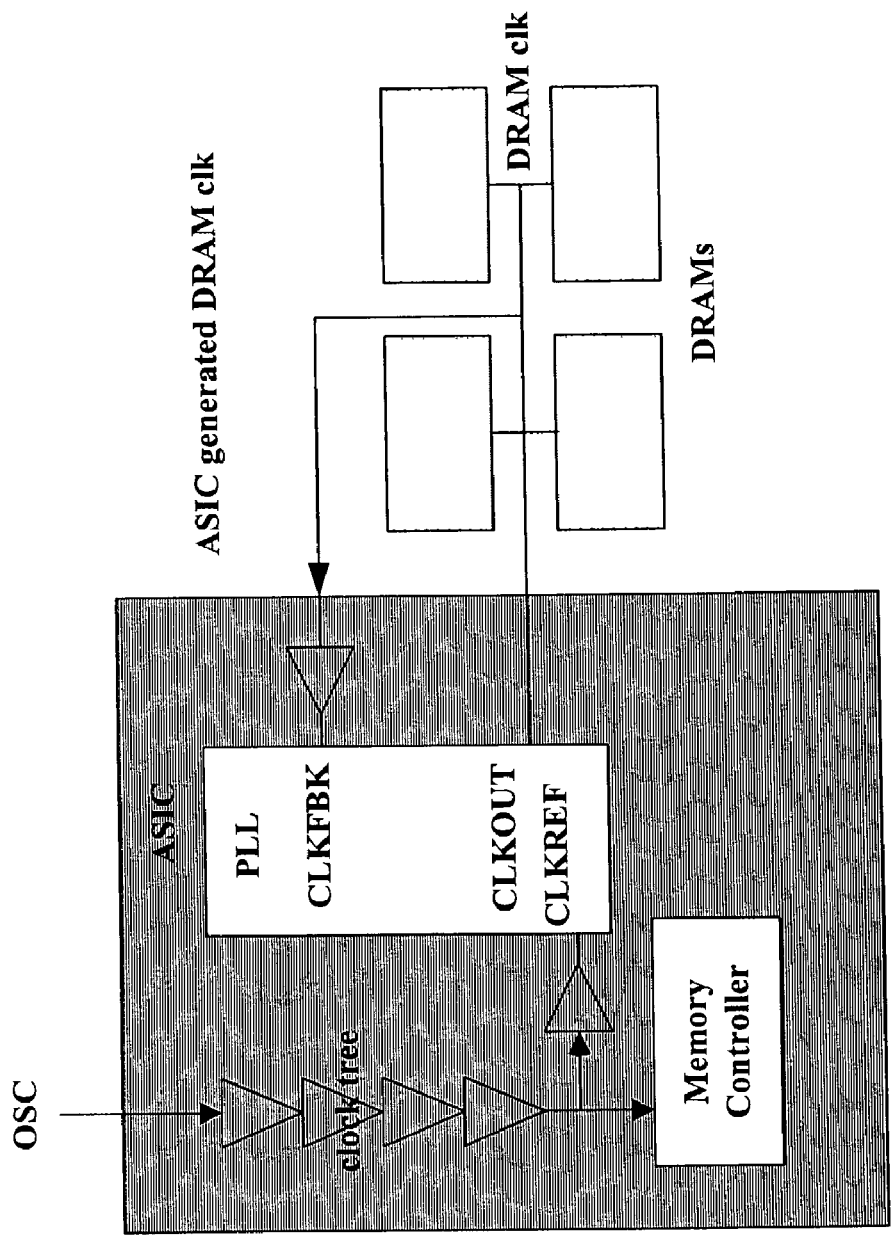
FIGS. 2B–C illustrate two implementations of clock de-skew circuitry.
Figure 2C:
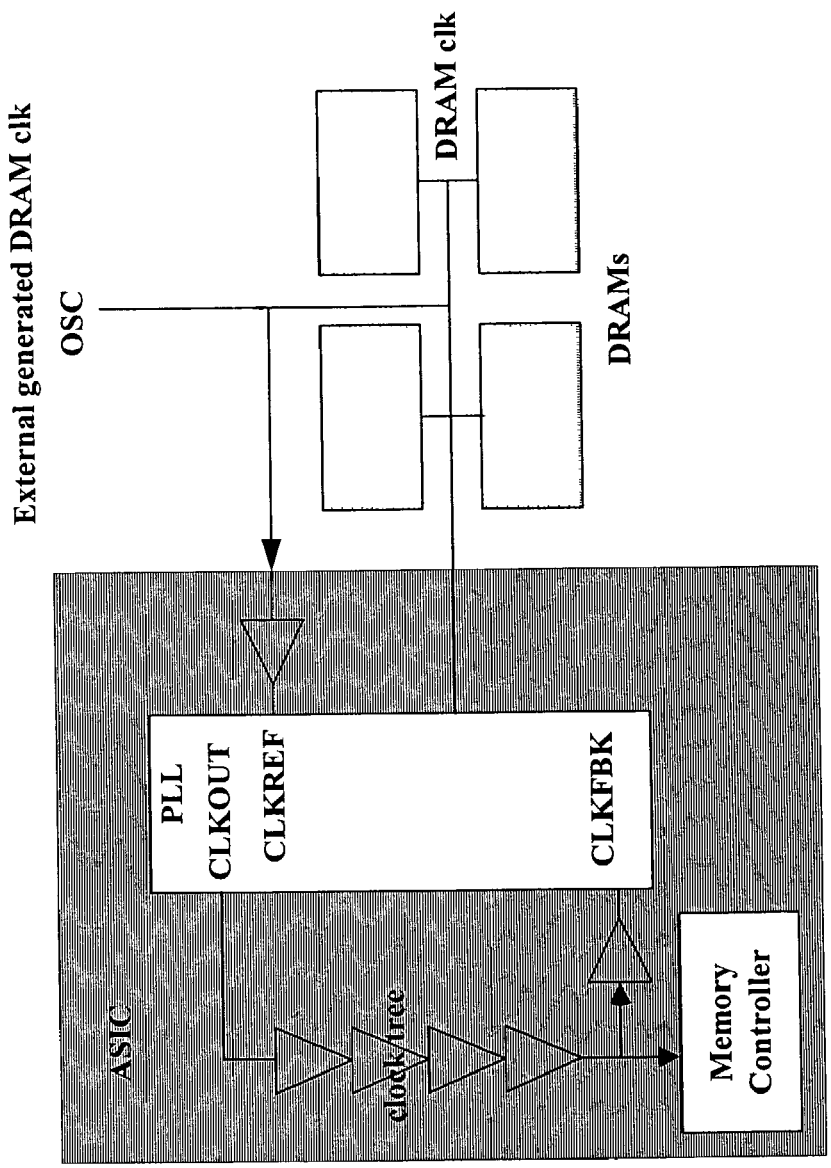

FIGS. 2B–C illustrate two possible implementations of the clock de-skew circuitry. In both cases, the phase lock loop (PLL) is used to add delay to the CLKOUT signal until the rising edges of CLKFBK and CLKREF are coincident. The delay introduced by the PLL is added after the clock tree in order to match the additional delay introduced by the input buffer on the ASIC. The feedback clock trace on the ASIC is matched to the trace length from the clock source (OSC) to the DRAMs. In the case of the external generated clock illustrated in FIG. 2C, the additional delay compensates for the insertion delay of the reference clock. The clock input trace is balanced with the trace lengths to the DRAMs.

In addition to the clock de-skew circuitry, the I/O cells used in conjunction with the memory controller also help maintain the appropriate timing relationships for the data, data strobes and control signals. In one embodiment of the invention, four types of I/O cells are used to interface between the memory controller and the DDR memory. The four I/O cells include the control output cell, the data mask output cell, the data I/O cell and the data strobe I/O cell. These I/O cells are used to output the control signals and write data needed by the DDR memory during a write operation. The I/O cells, in combination with the memory controller, improve the reliability of data capture by the DDR memory. To maximize the data valid window, the I/O cells are positioned as close to the pad drivers of the ASIC as possible to minimize skew and ensure the signals are properly aligned when output from the ASIC.

Figure 3:
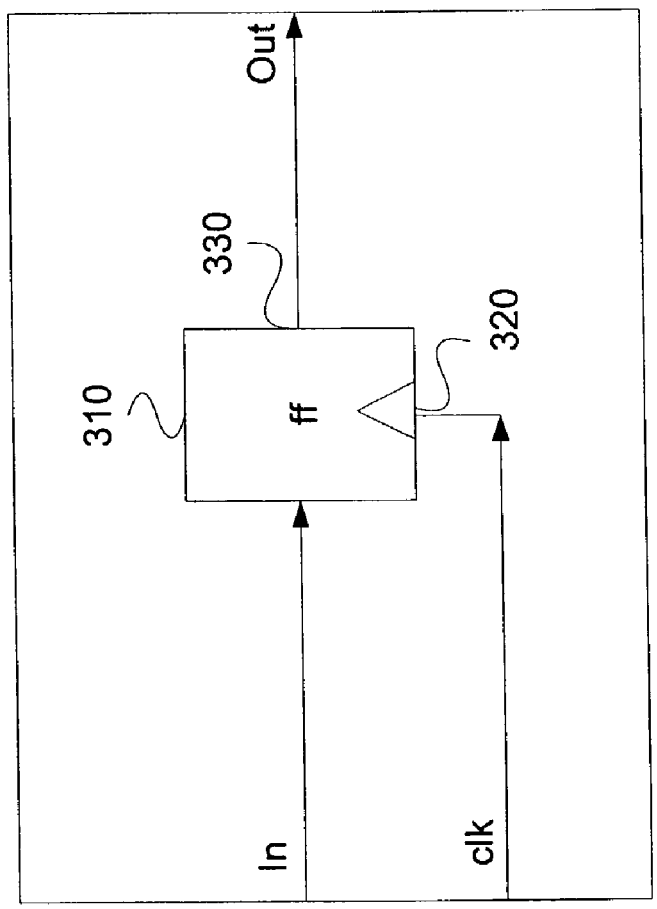
FIG. 3 is a block diagram of a control output cell.

FIG. 3 is a block diagram of control output cell 300. FIG. 3 illustrates a single flip flop 310. In a preferred embodiment, flip flop 310 is a D-type flip flop that transitions when the clock signal at input 320 transitions from low to high. In one embodiment, flip flop 310 accepts a control signal from the controller. The control signal is clocked into flip flop 310 on the positive edge of the clock signal at input 320. This control signal is then output 330 of flip flop 310 to the output pad that is connected to the corresponding pin on the external DDR memory.

The number of control output cells 300 used in an implementation depends on the number of control signals transferred from the controller to the DDR memory. One control output cell 300 is used for each control signal. In one embodiment, the control signals that can be transmitted through a separate control output cell 300 include those listed in Table 1 below. Thus, for this embodiment, seven control output cells 300 are needed to transfer the control signals in Table 1 from the controller to the DDR memory.

TABLE 1

| DDR SDRAM Signal | Controller Signal | Description |
| --- | --- | --- |
| CS_n | control_cs_n | Chip select signal to DDR SDRAM devices |
| CKE | control_cke | Clock enable signal to DDR SDRAM devices |
| RAS_n | control_ras_n | Row active pin to DDR SDRAM devices |
| CAS_n | control_cas_n | Column activate to the DDR SDRAM devices |
| WE_n | control_we_n | Write Enable signal to DDR SDRAM devices |
| BA | control_bank | Bank control signals to DDR SDRAM devices |
| ADDR | control_address | Address signals to the DDR SDRAM devices |

Figure 4:
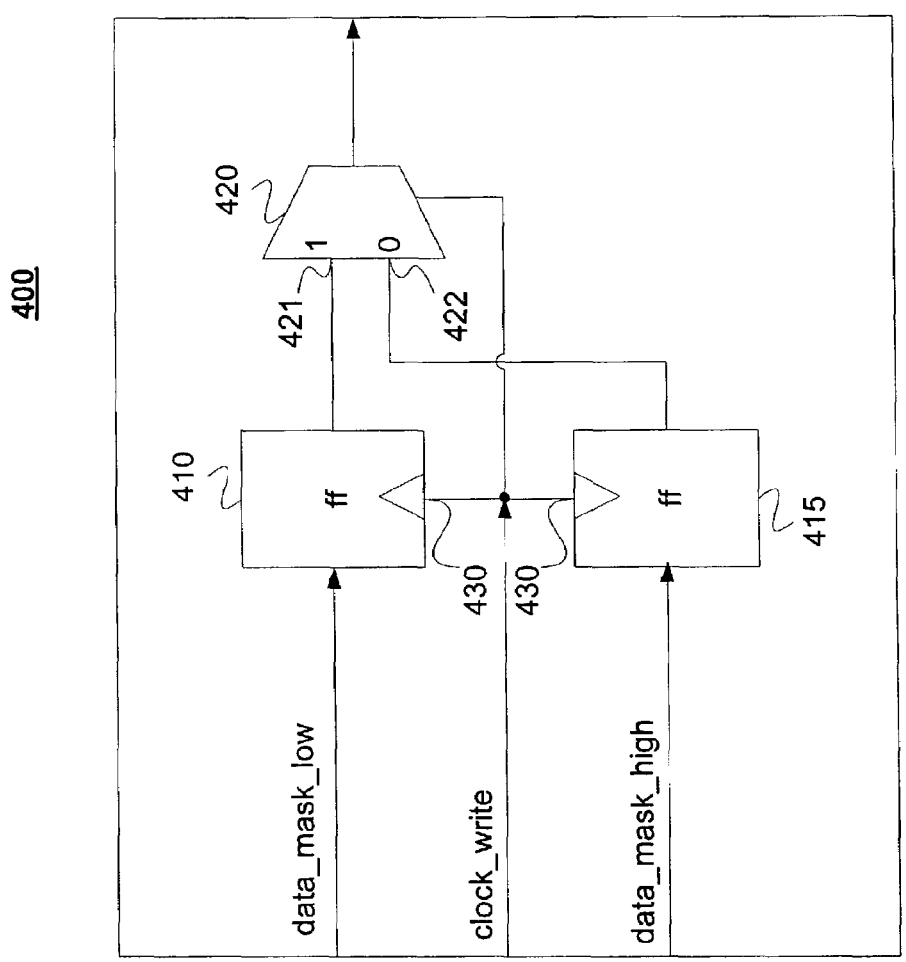
FIG. 4 is a block diagram of a data mask output cell.

FIG. 4 is a block diagram of the data mask output cell 400. Data mask output cell 400 is designed to send the data mask information from the memory controller to the DDR memory during a write operation. Data masks are generated by the memory controller to inform the DDR memory which bytes of data to write to memory. Data mask output cell 400 comprises two flip flops 410 and 415 and a 2:1 multiplexer (MUX) 420. In a preferred embodiment flip flops 410 and 415 are D-type flip flops that register the data at their inputs when the clock signal input 430 transitions from low to high.

Typically, one data mask bit is forwarded with each byte of the data words transferred to memory. For example, if a 32 bit word is transferred to memory, 4 data mask bits are required, one for each byte in the word. The data mask bits let the DDR memory know which bytes of the data word contain valid data that needs to be written to memory. Thus, 4 data mask output cells are needed for a 32-bit word embodiment. If the data mask for a byte is low, the memory will not write the byte to memory. If the data mask for a byte is high, the memory will write that byte of data to memory.

In a single data rate memory device, only one data word is transferred to memory per clock cycle. Thus, only one data mask bit is transferred per clock cycle for each byte of the data word. However, in a double data rate device, two data words are transferred per clock cycle, therefore, two data mask bits are transferred per clock cycle to the DDR memory. In the single data rate device, only one flip flop is needed per byte; however, for the double data rate device, two flip flops are needed along with a 2:1 MUX for each byte of the data word. For example, in the 32-bit data word example, 4 data mask output cells 400 are needed.

In FIG. 4, a data mask for the low byte (herein data mask low) is input to flip flop 410 and a data mask for the high byte (herein data mask high) is input to flip flop 415. Flip flops 410 and 415 register the data at their inputs, data mask low and data mask high respectively, when their clock inputs transition from low to high. In one embodiment, clock write is used as the clock input to flip flops 410 and 415. Clock write is a clock signal generated by the controller that is used to register write data, write data mask and control signals involved in the write transfer to DDR memory devices.

The data registered in flip flops 410 and 415 is output to MUX 420. The output of flip flop 410 is input into the high (i.e. one) input 421 of MUX 420 and the output of flip flop 415 is input into the low (i.e. zero) input 422 of MUX 420. The select line for MUX 420 is the same clock signal used to clock flip flops 410 and 415. Therefore, when the clock transitions from low to high, flip flops 410 and 415 both register the data at their inputs and the output from MUX 420 is the data received from flip flop 410 (since the clock is high). When the clock transitions from high to low, the output of MUX 420 changes to the data received from flip flop 415. The values in flip flops 410 and 415 remain stable during the entire clock cycle since the flip flops only register data when the clock transitions from low to high but the output of MUX 420 changes at each transition of the clock. Thus, the output from flip flops 410 and 415 are both output from MUX 420 during a clock cycle.

Figure 5A:
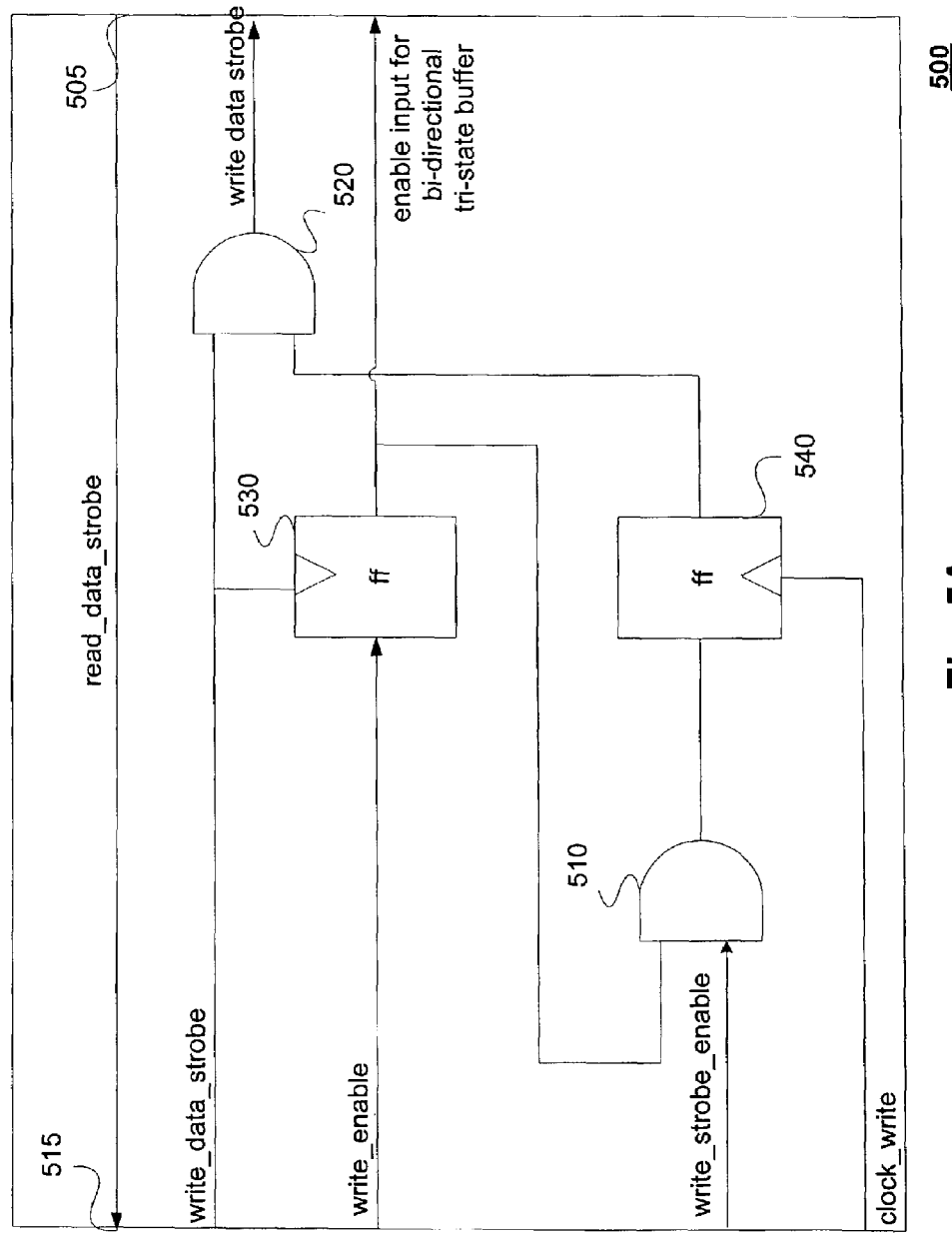
FIG. 5A is a block diagram of a data strobe cell.

FIG. 5A is a schematic diagram of data strobe I/O cell 500. Data strobe I/O cell 500 sends and receives the read and write data strobes used during read and write operations. Data strobe I/O cell 500 comprises two flip flops 530 and 540, and two AND gates 510 and 520. In one embodiment, flip flops 530 and 540 are D-type flip flops that register the data at their inputs when the clock signals at their respective clock inputs transition from low to high.

Figure 6A:
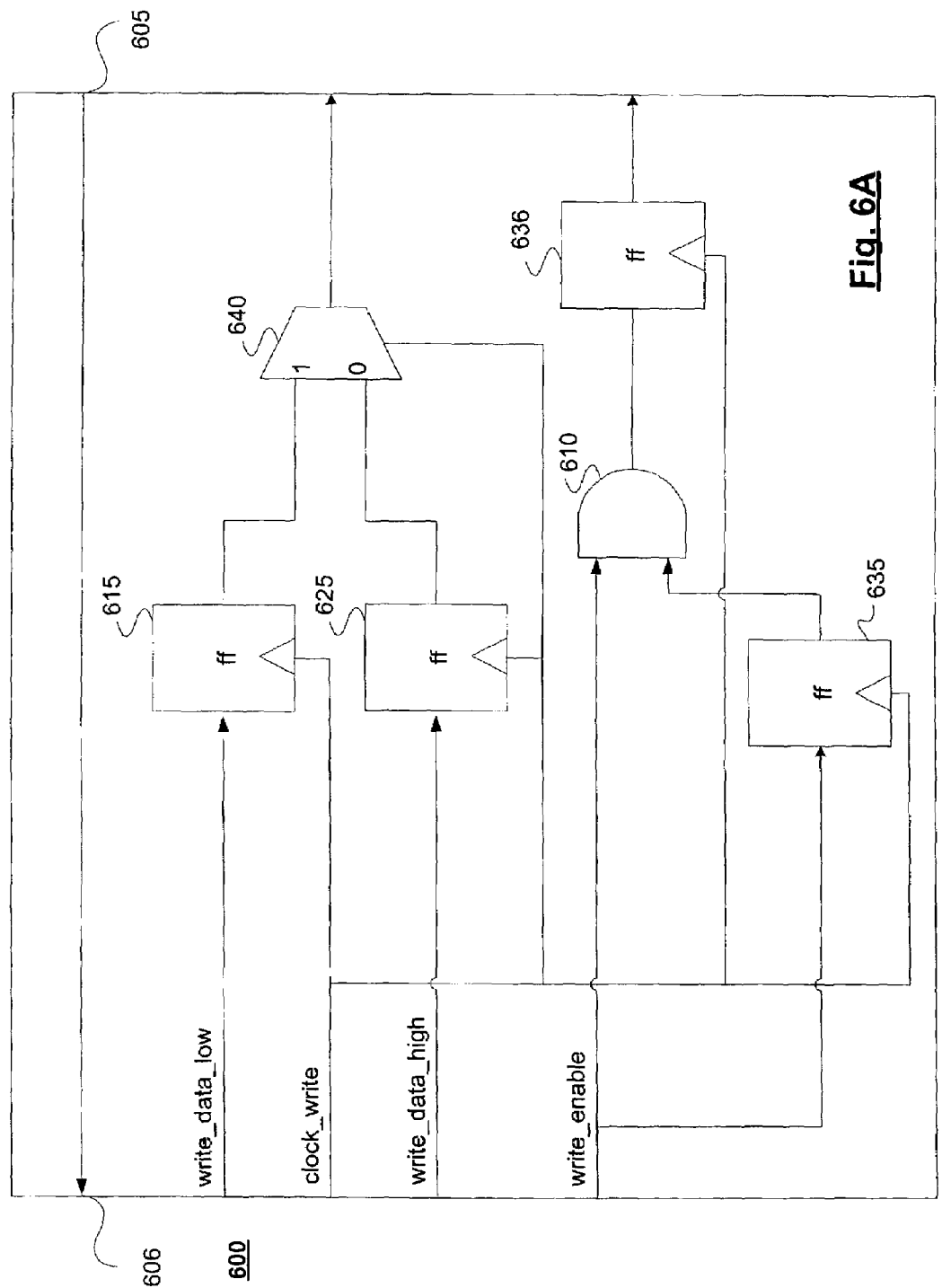
FIG. 6A is an illustration of a data I/O cell 600.
Figure 6B:
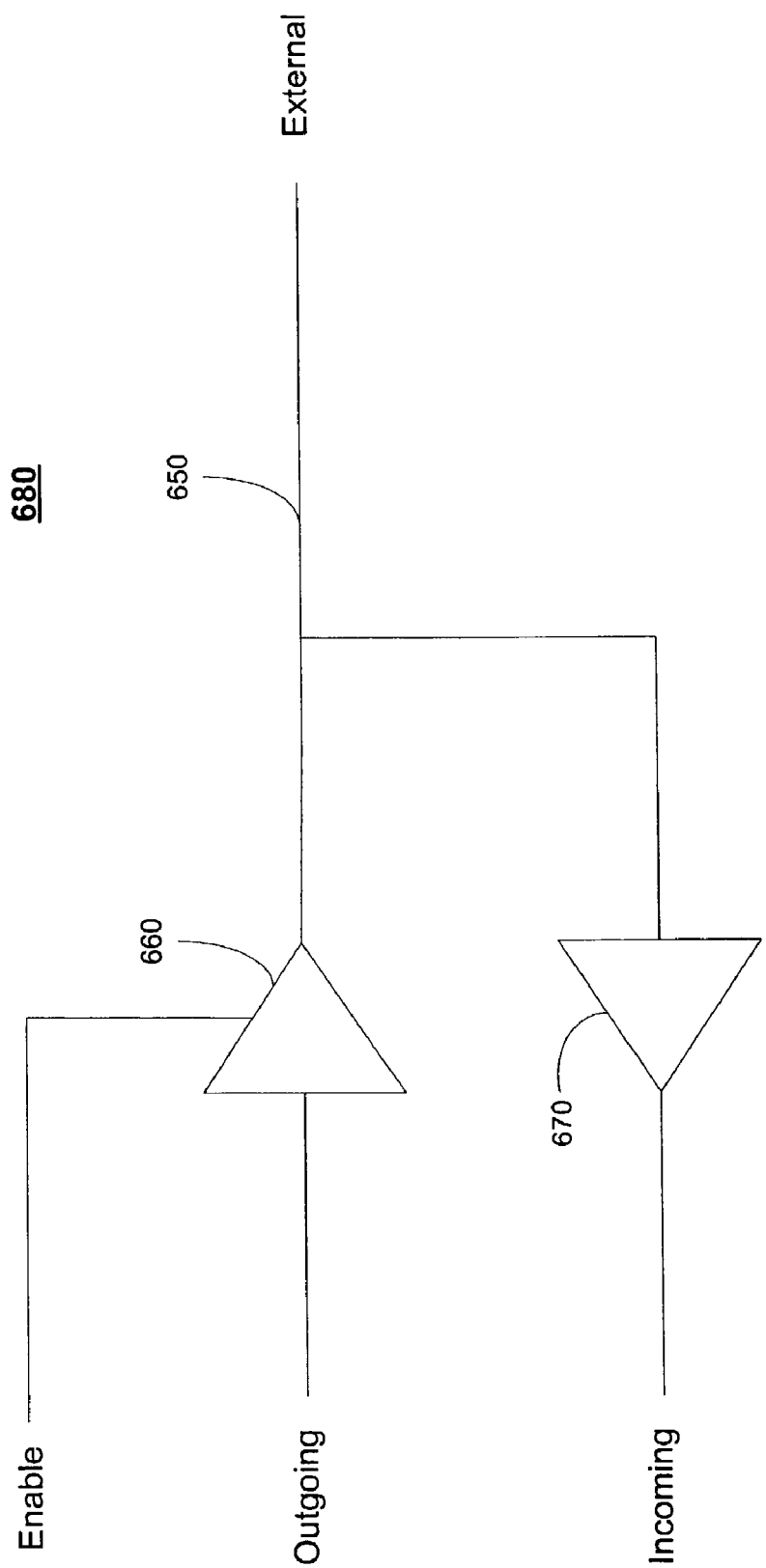
FIG. 6B is an illustration of a bi-directional tri-state buffer 680.

In a preferred embodiment, date strobe I/O cell 500 is coupled to tri-state buffer 680, illustrated in FIG. 6B. Tri-state buffer 680 is a bi-directional buffer located on the pad ring of the ASIC and is coupled to the data strobe pin on the edge of the ASIC that is used to send and receive the read and write data strobes from the DDR memory. Tri-state buffer 680 includes two buffers 660 and 670 that allow tri-state buffer 680 to both send and receive data. Buffer 660 is the output buffer that is used to drive data out of tri-state buffer 680 and buffer 670 is the input buffer that receives data from an external source (in this case a DDR memory). As illustrated, the output of buffer 660 and the input to buffer 670 are coupled to the same outgoing line 650. In addition, buffer 660 has an enable input, which determines if the bi-directional buffer is operating to output or receive data. When the enable input is low, a high impedence is created in buffer 660. As a result, the incoming data will input buffer 670 from line 650 rather than buffer 660. When the enable input is high, buffer 660 receives data at its input and drives the data out of tri-state buffer 680 on line 650 to the DDR memory.

During a read operation, data strobe I/O cell 500 outputs a low enable input to tri-state buffer 680. As a result, data strobe I/O cell 500 receives the read data strobe from the DDR memory at input 505 through buffer 670 of tri-state buffer 680. The read data strobe passes through data strobe I/O cell 500 and is output to a delay circuit through output 515. The delay circuit and the read data capture cell are described further herein.

During a write operation, data strobe I/O cell 500 outputs a high enable input to tri-state buffer 680 and outputs the write data strobe to buffer 660. The enable input precedes the write data strobe by one clock cycle. This allows time for the tri-state buffer 680 to stabilize before sending any data to the DDR memory. Tri-state buffer 680 outputs the write data strobe to the DDR memory. The write data strobe is used by the DDR memory to write the corresponding write data to memory. However, since the memory does not know when to expect a write operation, memory devices typically require a preamble to be sent prior to the write data strobe. The preamble indicates to the memory that a write data strobe is about to be received.

The write enable control signal is received by data strobe I/O cell 500 and input to flip flop 530. Flip flop 530 is clocked by the write data strobe, thus when the write data strobe transitions from low to high, the write enable control signal is registered in flip flop 530. The write enable control signal is output from flip flop 530 to one of the inputs of AND gate 510. The write enable control signal output from flip flop 530 is also input to the enable input of tri-state buffer 680 to control whether the buffer is sending or receiving data.

The write strobe enable control signal is received by data strobe I/O cell 500 and input to the second input of AND gate 510. Write strobe enable is a control signal from the memory controller that enables the toggling of the write data strobe during a write operation. When write strobe enable is low, the output of flip flop 540 is also low. AND gate 520 receives write data strobe at one input and the output of flip flop 540 at the other input. When the output of flip flop 540 is low, the output of AND gate 520 is also low. When the output of flip flop 540 is high, the output of AND gate 520 is write data strobe. Thus, write strobe enable can be used to create the necessary preamble by driving the output of AND gate 520 low for the number of clock cycles required by the memory device that is to receive the write data strobe. After that, write strobe enable is high and AND gate 520 outputs write data strobe.

For example, in one embodiment the DDR memory requires that the write data strobe is driven low for two clock cycles before the toggling of the write data strobe begins. This embodiment is described using the traces illustrated in FIG. 5B. In this embodiment, the write enable control signal is output to the enable input of bi-directional tri-state buffer 680. When this value is high, the tri-state buffer 680 will output the data received at its input to the DDR memory. However, write data strobe is not input to the tri-state buffer 680 until the write data strobe enable control signal is high. When the write data strobe enable is low, the data input of tri-state buffer 680 will receive a low input from AND gate 520. Tri-state buffer 680 will continue to output a low signal to the DDR memory as long as write data strobe enable is low.

This embodiment of the invention allows the preamble to be adjusted using the write enable and write data strobe enable control signals. In the example illustrated in FIG. 5B, the write data strobe output to the DDR memory is driven low for two clock cycles and then toggles according to the write data strobe input to data strobe I/O cell 500. Note that the clock write signal used to clock flip flop 540 is generated in the memory controller and is used to register write data, write data mask and control signals involved in write operations.

In a preferred embodiment, the clock write signal has the same frequency as the write data strobe and is ¼ of a clock cycle ahead of the write data strobe. The reason for this is that the clock write signal is also used to clock the write data as described herein. The ¼ clock cycle head start allows the write data to be output ¼ of a clock cycle ahead of the write data strobe. As a result, the rising and falling edges of the write data strobe are aligned with the center of the write data when output from the data strobe I/O cell and data I/O cell respectively.

FIG. 6A is a schematic diagram of data I/O cell 600. Data I/O cell 600 is used to send write data to the DDR memory during a write operation and receive read data from the DDR memory during a read operation. Each data I/O cell 600 handles two bits of data per clock cycle when interfacing with a DDR memory, one bit during the first half of the clock cycle and one bit during the second half of the clock cycle. The number of data I/O cells 600 used in an implementation depends on the width of the data path to the DDR memory. For example, a 32 bit data path requires 32 data I/O cells 600, resulting in 64 bits of data transferred between the ASIC and the DDR memory during a single clock cycle.

In a preferred embodiment, date I/O cell 600 is coupled to tri-state buffer 680. Tri-state buffer 680 is a bi-directional buffer located on the pad ring of the ASIC that is coupled to the read/write data pin. Tri-state buffer 680 includes two buffers 660 and 670 that allow it to both send and receive data. Buffer 660 is the output buffer that is used to drive data out of tri-state buffer 680 and buffer 670 is the input buffer that receives data from an external source (in this case a DDR memory). As illustrated, the output of buffer 660 and the input to buffer 670 are coupled to the same outgoing line 650. In addition, buffer 660 has an enable input, which determines if the bi-directional buffer is operating to output or receive data. When the enable input is low, a high impedance is created in buffer 660. As a result, the incoming data will input buffer 670 rather than buffer 660. When the enable input is high, buffer 660 receives data at its input and drives the data out of tri-state buffer 680.

During a read operation, data I/O cell 600 outputs a low enable input to tri-state buffer 680. As a result, data I/O cell 600 receives the read data from the DDR memory at input 605 through buffer 670 of tri-state buffer 680. The read data passes through data I/O cell 600 and is output to the read data capture cell (described herein) through output 606. During a write operation, data I/O cell 600 outputs a high enable input to tri-state buffer along with the write data as described herein.

Data I/O cell 600 is comprised of four flip flops 615, 625, 635 and 636, AND gate 610 and a 2:1 multiplexer (MUX) 640. In a preferred embodiment, flip flops 615, 625, 635 and 636 are D-type flip flops that register data when their input clock transitions from low to high. Flip flop 635 receives a write enable signal at its input and registers this value when the clock write signal transitions from low to high. The output of flip flop 635 is coupled to one of the inputs to AND gate 610. The other input of AND gate 610 receives the input write enable signal, which remains high during the entire write operation. The output of AND gate 610 is input to flip flop 636 which registers the value output from AND gate 610 during the next transition of clock write from low to high. The output of flip flop 636 is coupled to the enable input 660 of tri-state buffer 680 and is used to control whether tri-state buffer 680 sends or receives data.

Flip flops 615 and 625 output write data to buffer 660 of tri-state buffer 680 which outputs the data to the DDR memory. As illustrated in FIG. 6A, flip flop 615 receives a bit of data for the low word, herein write data low, and flip flop 625 receives a bit of data from the high word, herein write data high, at their respective inputs. Clock write is the clock signal used to clock flip flops 615 and 625. As mentioned above, the clock write signal is generated by the memory controller and is used to register write data, write data mask and control signals involved in the write transfer to the DDR memory. When clock write transitions from low to high, flip flops 615 and 625 register the data at their respective inputs, write data low and write data high. Write data low and write data high are output to MUX 640 whose select line is also driven by clock write. When clock write is high (i.e., one), MUX 640 outputs the bit from flip flop 615 and when clock write is low (i.e., zero), MUX 640 outputs the bit from flip flop 625. This configuration allows the low word to be sent during the first half of a clock write clock cycle and the high word to be sent during the second half of the clock cycle.

The operation of data I/O cell 600 will now be described in relation to data strobe I/O cell 500 and the clock traces illustrated in FIG. 5B.

When write enable transitions from low to high, the high value is clocked into flip flop 635 when the clock write signal transitions from low to high. The high value is output from flip flop 635 to one of the inputs to AND gate 610. The second input to AND gate 610 receives write enable, which remains high for the duration of the write operation. AND gate 610 performs the logical AND of these two inputs and outputs a high value to flip flop 636 which clocks the value into the flip flop on the next transition of clock write from low to high. Returning now to FIG. 5B, the high value is clocked into flip flop 636 at the transition of clock write illustrated by dotted line 675. When this occurs tri-state buffer 680 is enabled to output data rather than receive data. Note, however, that the preamble to the write data strobe is still being output at the point in time represented by dotted line 675. Thus, write data is not output immediately. However, during the next transition of clock write, the write data needs to be available at the inputs to flip flops 615 and 625 so the data can be output from tri-state buffer 680 at the point in time represented by dotted line 685.

Figure 5B:
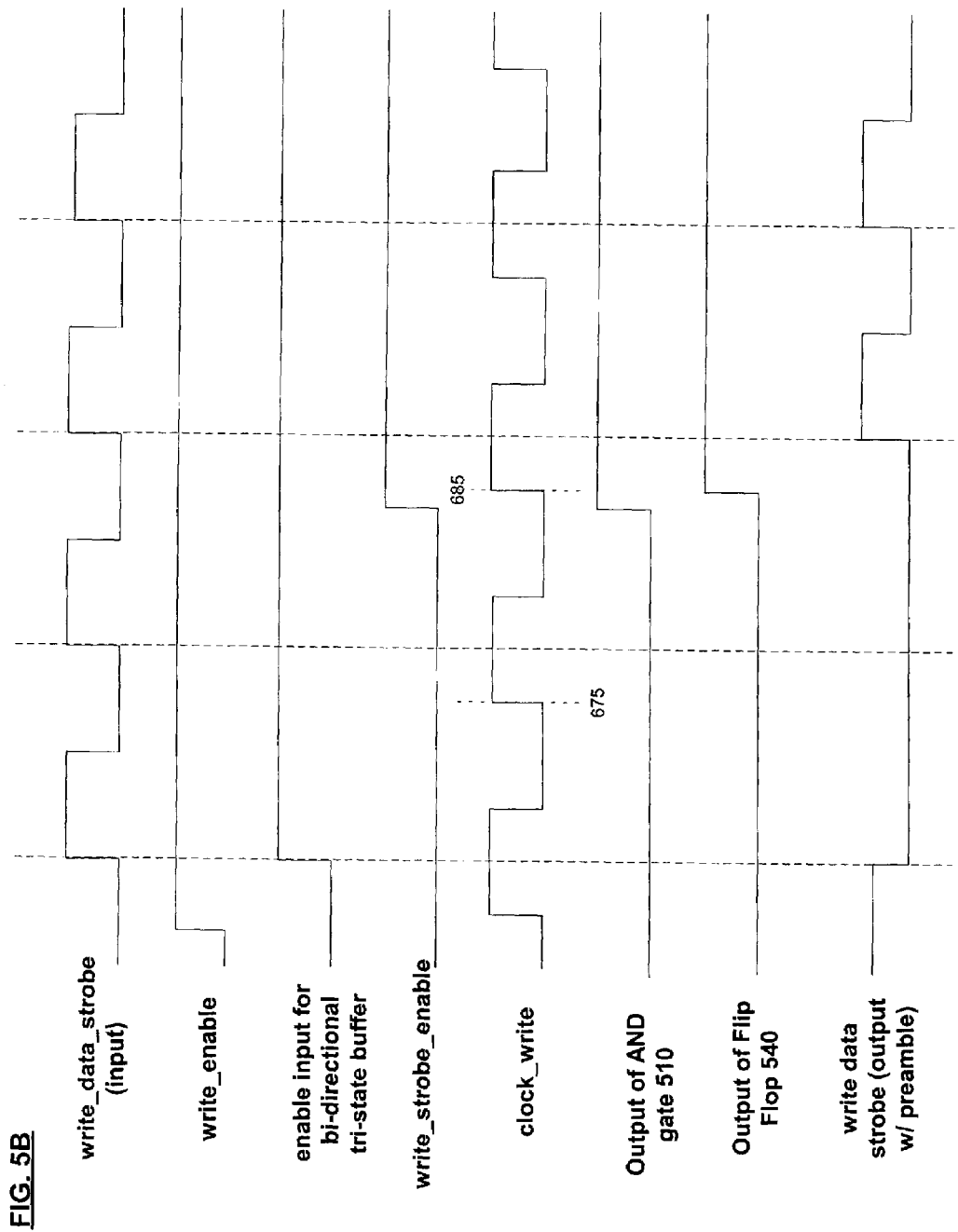
FIG. 5B illustrates various clock traces used to describe the operation of data strobe I/O cell 500.

As one can see from FIG. 5B, the write data is output starting at the transition of clock write at dotted line 685. The output of flip flop 615 is output during the first half of the clock cycle and the output of flip flop 625 is output during the second half of the clock cycle. Note that the corresponding write data strobe (illustrated in the figure) is aligned such that the transitions in the write data strobe occur half way between the transitions of the clock write signal. As a result, the write data strobe and write data are output with the appropriate timing relationship (i.e. the transitions of the write data strobe are aligned with the center of the write data).

Figure 7A:
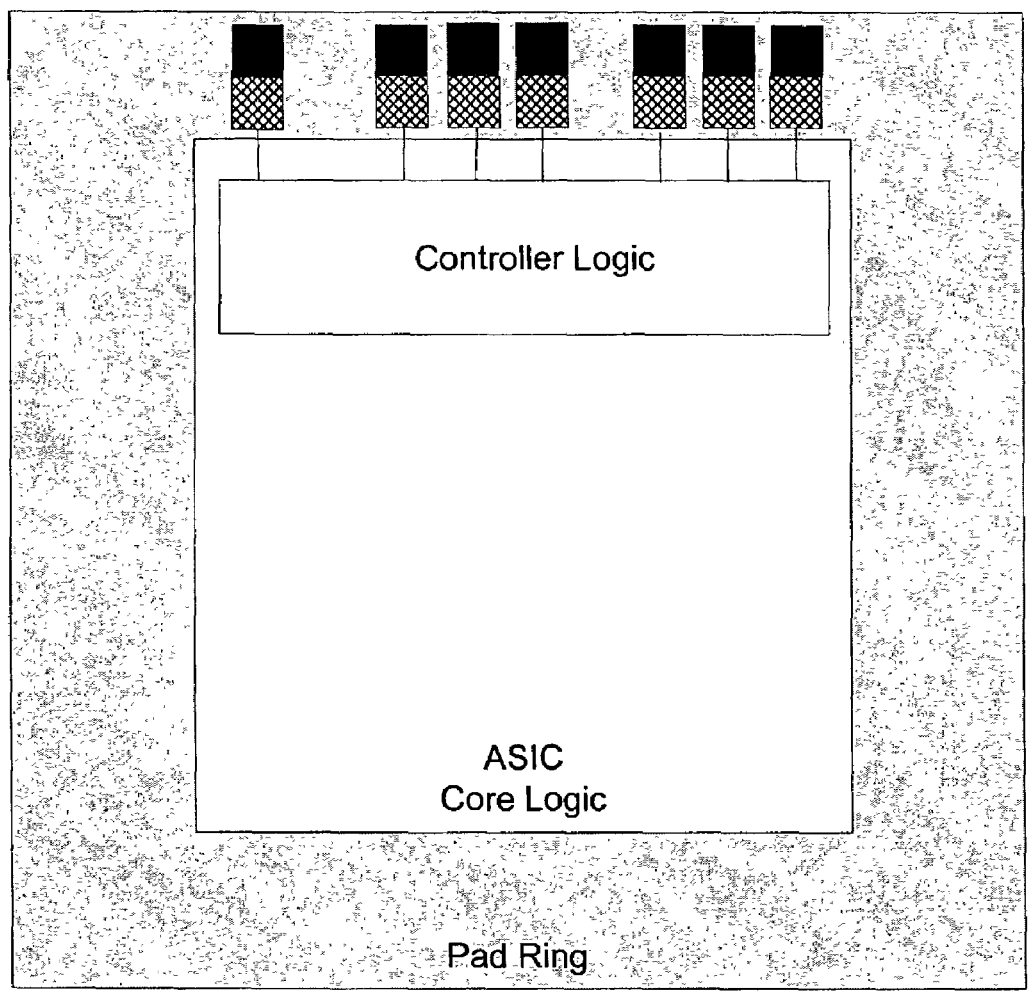
FIGS. 7A–D illustrate various embodiments of the position of the I/O cells.
Figure 7B:
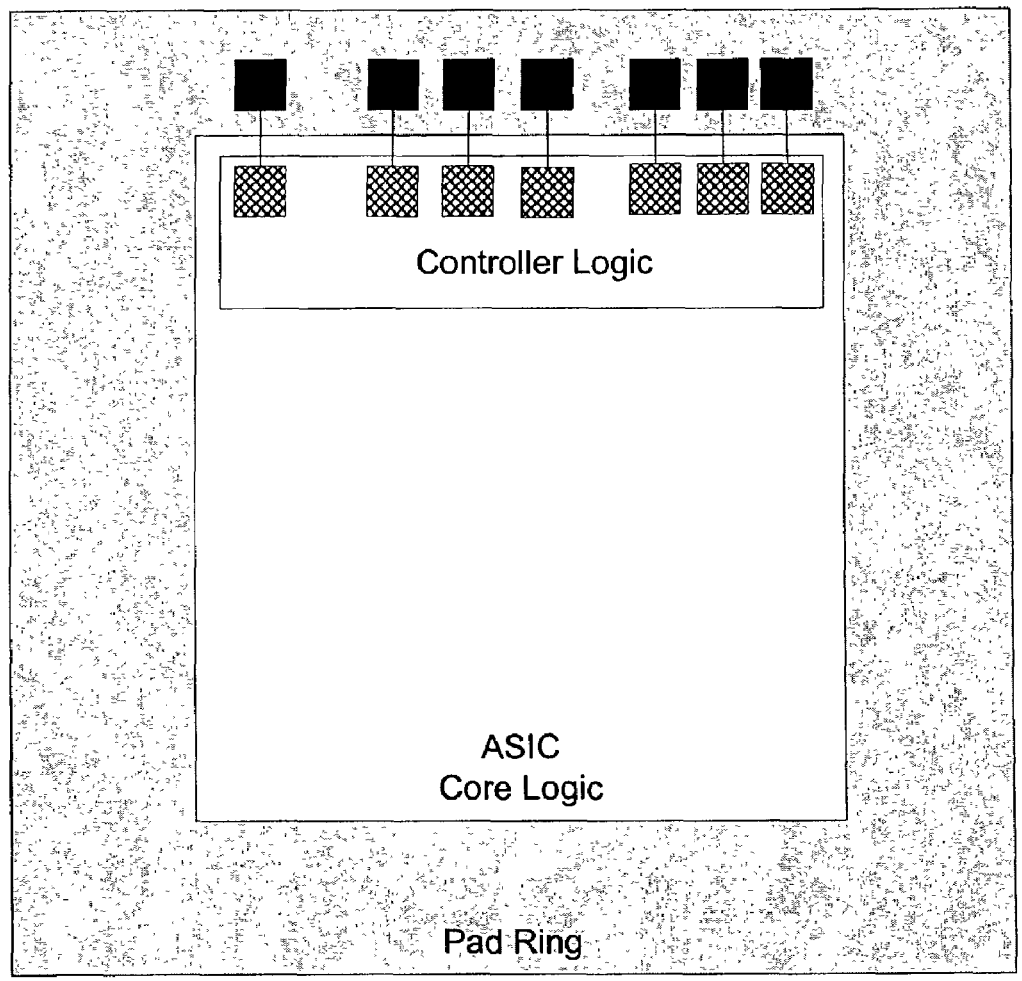
Figure 7C:
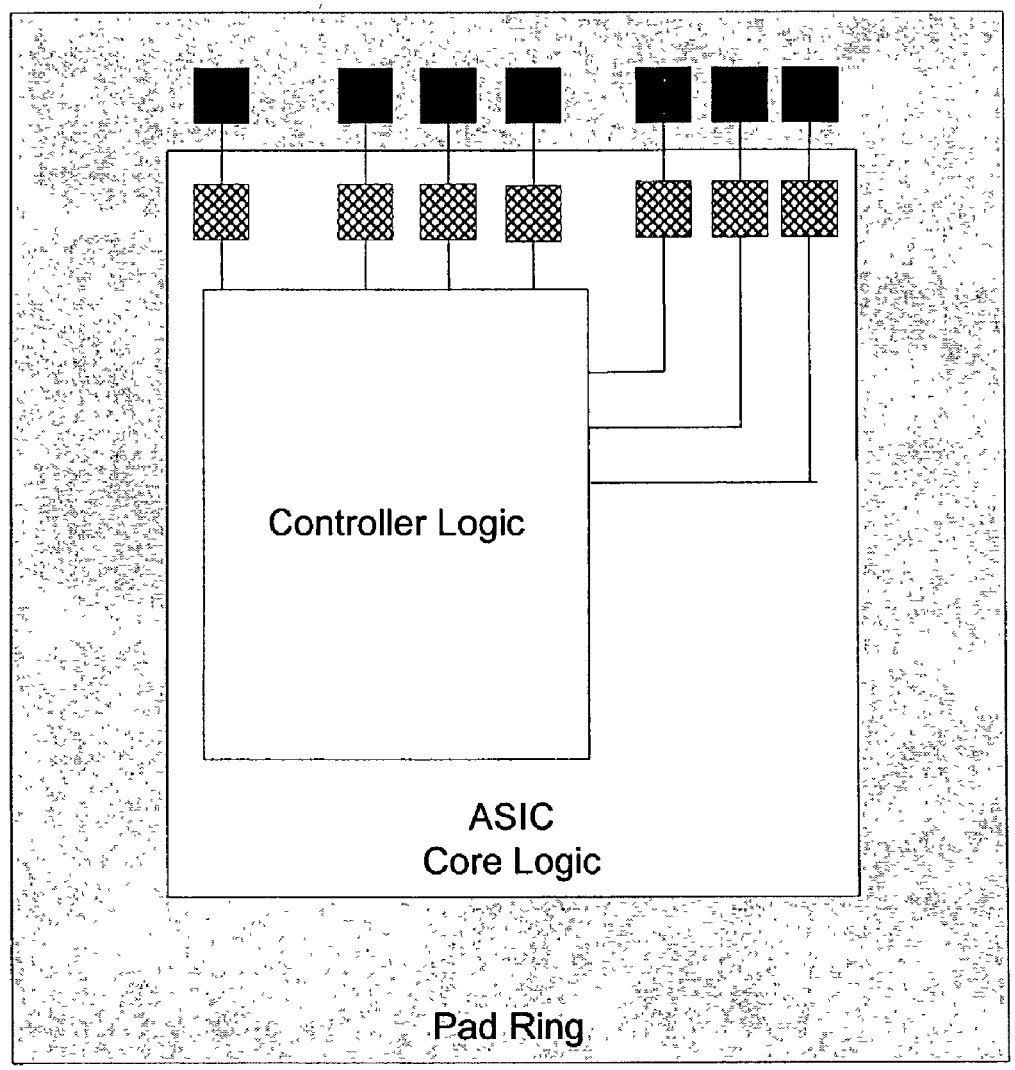
Figure 7D:
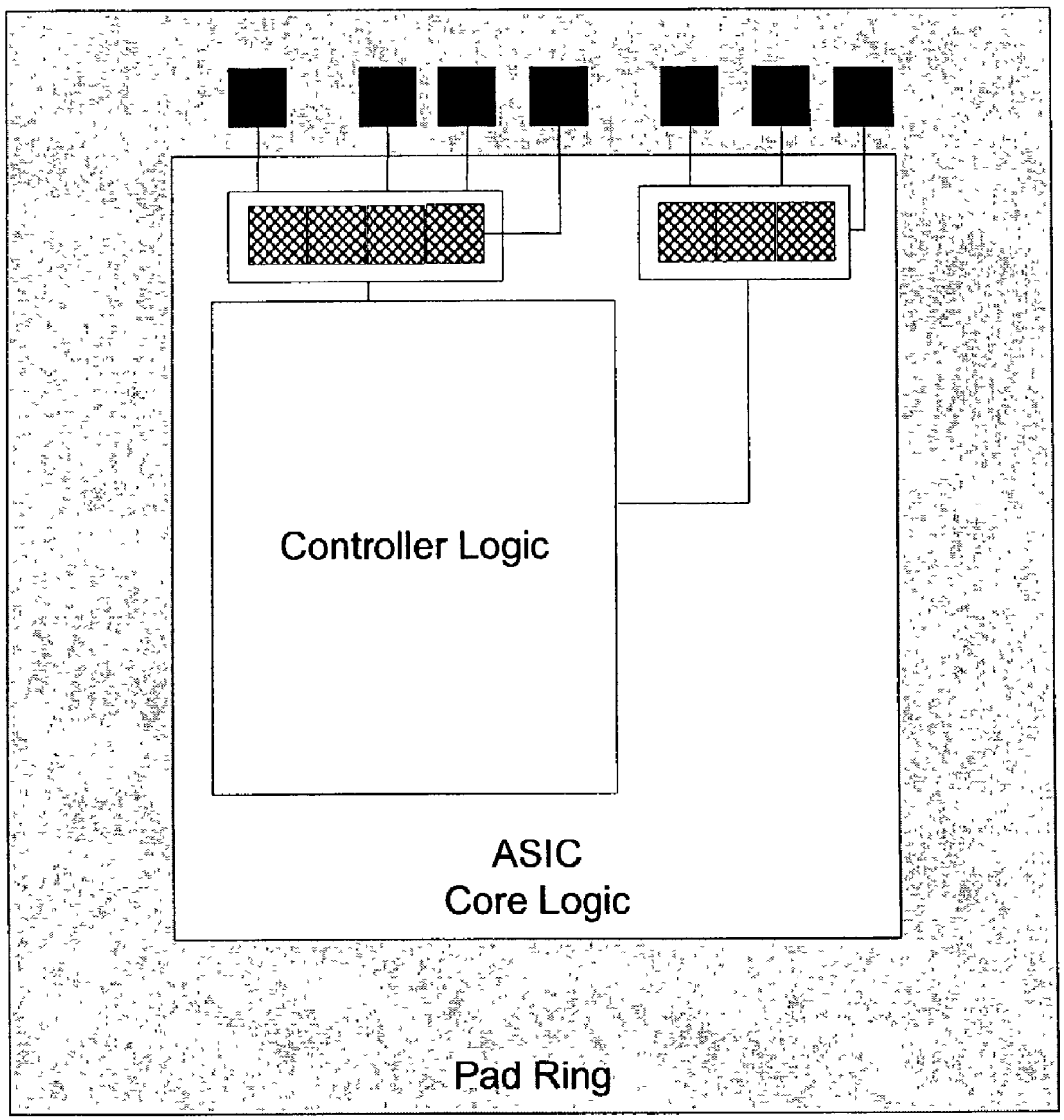
Figure 7D:
Figure 7D:

With respect to all of the I/O cells described above, in a preferred embodiment, the I/O cells are positioned as close to the I/O pad of the ASIC (pad ring 220 in FIG. 2A) as possible. FIG. 7A illustrates this configuration. By eliminating any additional space between the I/O cells and the I/O pads, the chance of signal skew (unwanted delay variations in the signals) is reduced and the timing between the ASIC clocking domain and the outside clocking domain is more reliable. However, this invention is not limited to placing the I/O cells directly on the I/O pads. In a less conservative design, the I/O cells can be positioned further from the I/O pads as illustrated in FIGS. 7B, 7C and 7D. The designs in FIGS. 7B, 7C and 7D introduce the potential for skew, however, depending on the particular board design, the skew may be minimized or may fall within acceptable ranges.

Each of the I/O cells is coupled to a a tri-state buffer or a bi-directional tri-state buffer (illustrated in FIG. 6B) located on the I/O pad of the ASIC. I/O cells that only send data are coupled to a tri-state buffer to drive the data from the ASIC to the DDR memory. For example, control output cell 300 and data mask output cell 400 only output data to the DDR memory. As a result, their outputs are coupled to a tri-state buffer, which outputs the data to the DDR memory. As described above, data strobe I/O cell 500 and data I/O cell 600 both send and receive data from the DDR memory. Therefore, as described above, they are coupled, respectively, to bi-directional buffers 680, which can both send and receive data over the same line.

Although the embodiments above describe four types of I/O cells, further embodiments are possible that combine or eliminate some of these I/O cells. In addition, further embodiments might include additional I/O cells to provide the appropriate timing for other data or control signals sent between the ASIC clocking domain and the outside clocking domain. In addition, as illustrated in FIGS. 7A, 7B, 7C and 7D, the I/O cells can be located inside the memory controller logic or outside of the memory controller logic.

Another embodiment of the present invention provides circuitry for capturing read data from a DDR memory.

Figure 1A:
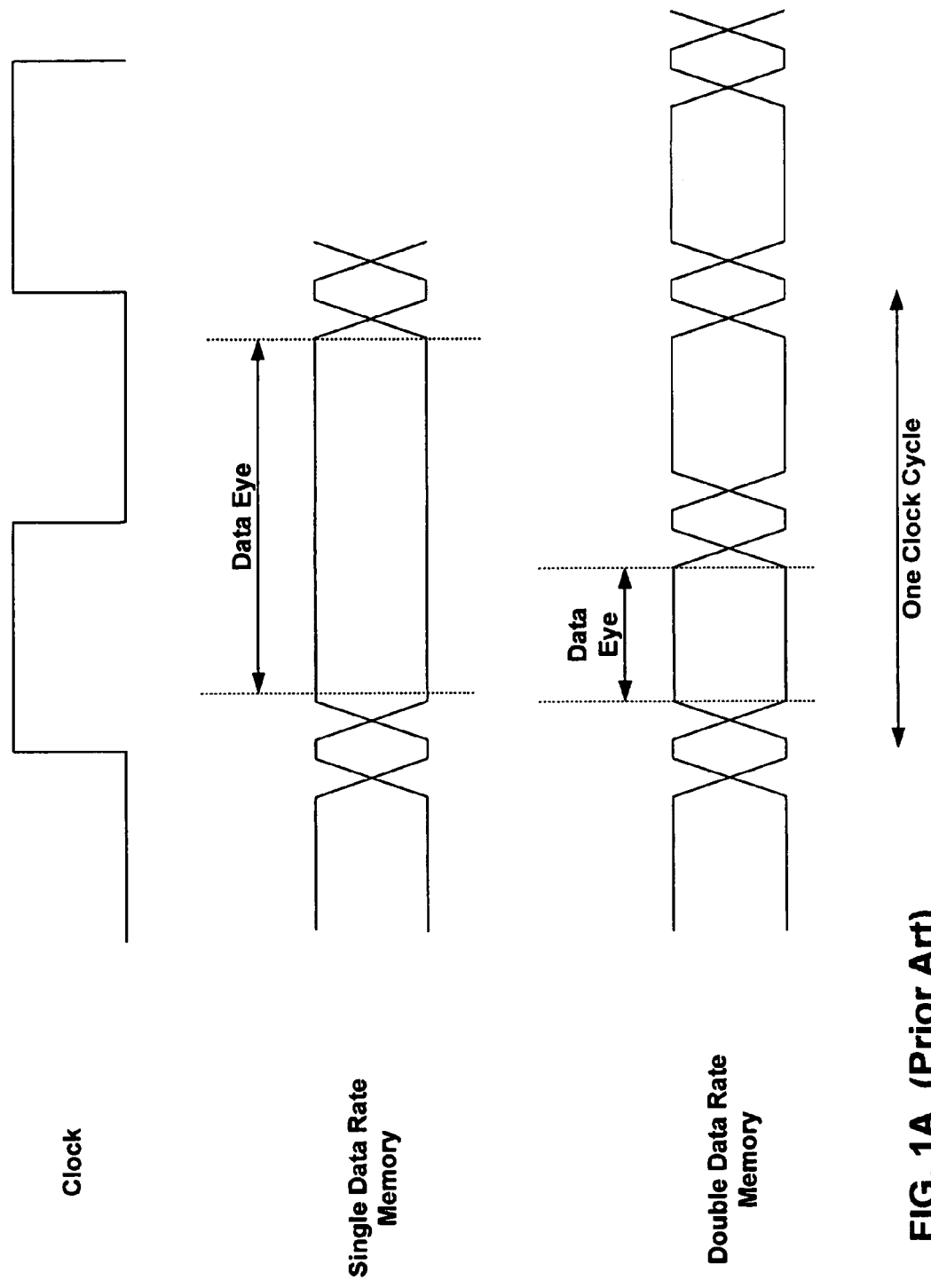
FIGS. 1A and 1B illustrate clock signals and data traces for single data rate and double data rate devices.
Figure 1B:
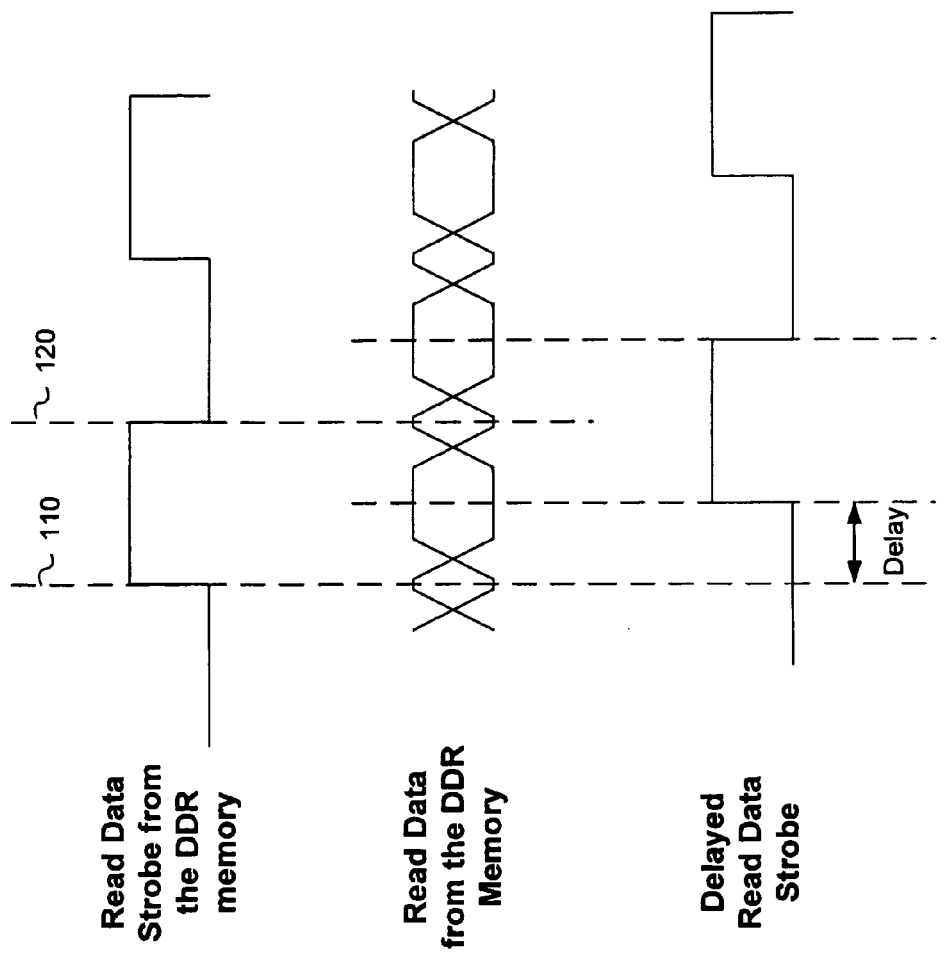

During a read operation, the DDR memory transfers read data along with a read data strobe to the ASIC. The read data strobe is used to capture the read data so that the read data can be synchronized from the DDR memory to the system clock of the ASIC. In other words, the read data is captured using the read data strobe and then clocked into registers using the system clock of the ASIC. However, when received, the read data strobe is not aligned with the data eye of the read data. As illustrated in FIG. 1B, the rising and falling edges of the read data strobe occur when the read data is in transition. In order to reliably capture the read data, the rising and falling edges of the read data strobe needs to be aligned with the data eye of the read data.

Figure 8A:
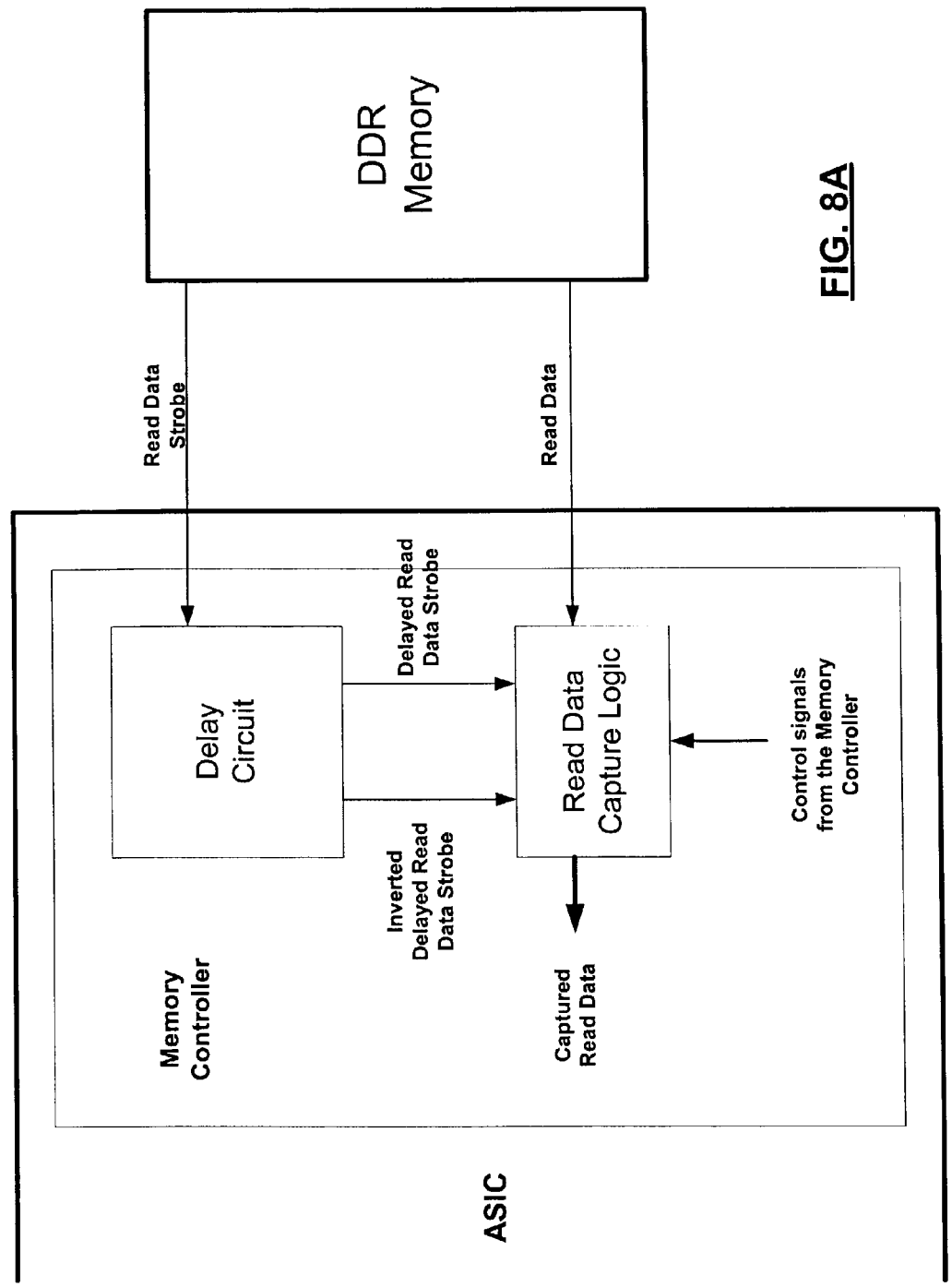
FIG. 8A is a block diagram illustrating the read data capture cell along with the delay circuit and DDR memory.

In one embodiment, illustrated in FIG. 8A, a delay circuit receives the read data strobe from the DDR memory (through data strobe I/O cell 500) and delays the read data strobe so that the rising and falling edges align with the data eye of the read data. The delay circuit outputs the delayed read data strobe and an inverted delayed read data strobe to the read data capture cell. The read data capture cell receives the read data from the DDR memory and uses the delayed read data strobe and the inverted delayed read data strobe from the delay circuit to capture the read data as described further herein.

In one embodiment of the invention, the delay circuit is a programmable delay circuit as described in co-pending application Ser. No. 10/211,691, now U.S. Pat. No. 6,665,230, entitled "Programmable Delay Compensation Circuit," by Steven Shrader, Art Gmurowski, Samitinjoy Pal and Michael McKeon. In this embodiment, the memory circuitry can be reused across varying board designs since the delay can be programmed to counter differences in the board design and the DDR memory being interfaced with.

In a preferred embodiment, the flight time for the read data from the DDR memory to the read data capture cell and the flight time for the read data strobe from the DDR memory to the delay circuit are identical to maximize the reliability of the data capture. Any deviation between the flight time of the read data strobe and the read data will affect the delay introduced by the delay circuit, thereby reducing the reliability of the data capture. In addition, the read data capture cell is positioned as close to the delay circuit as possible to minimize the flight time from the delay circuit to the read data capture cell as well as minimize any skew between the data and the clock signals.

Figure 8B:
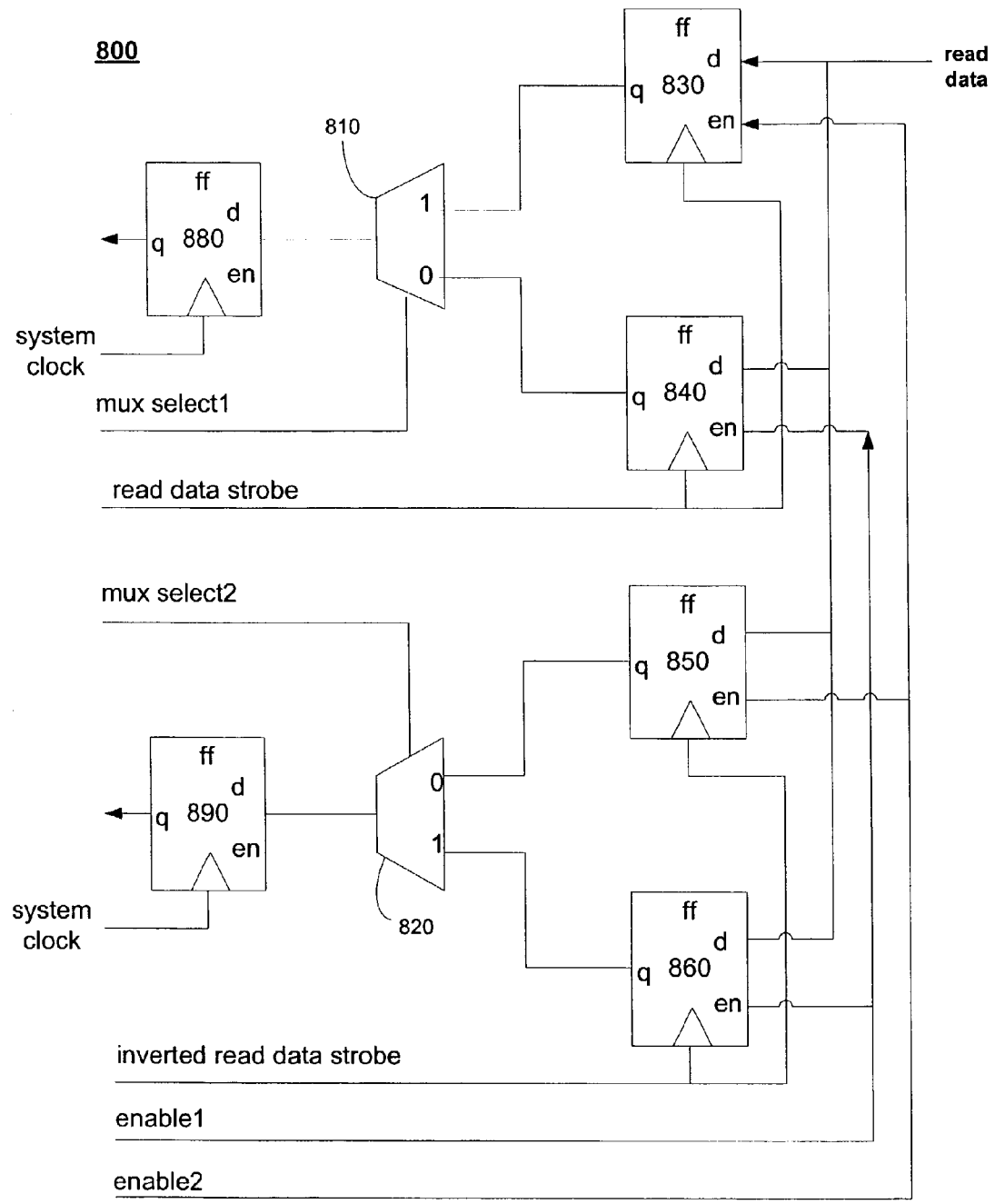
FIG. 8B illustrates read data capture cell 800.

FIG. 8B illustrates one embodiment of a read data capture cell 800 according to the present invention. Each read data capture cell 800 captures two bits of data per clock cycle, one on the rising edge of the read data strobe and one on the falling edge of the read data strobe. For a 32-bit data path between the DDR memory and the ASIC, 64-bits of data are transferred between the DDR memory and the ASIC per clock cycle. Thus, thirty two read data capture cells 800 are needed to capture the read data in the 32-bit data path example.

Read data capture cell 800 comprises six flip flops 830, 840, 850, 860, 880 and 890 and two 2:1 multiplexers (MUXs) 810 and 820. Flip flops 830, 840, 850 and 860 are used to capture the read data received from the DDR memory. In a preferred embodiment, flip flops 830, 840, 850, 860, 880 and 890 are D-type flip flops. Flip flops 830, 840, 850 and 860 are controlled by two inputs, a clock input and an enable input. When the enable input is high, the flip flops register the data at their inputs when their input clock signal transitions from low to high. When the enable input is low, the flip flops do not register data.

As illustrated in FIG. 8, flip flops 830 and 850 share the same enable input. However, flip flop 830 is clocked by the delayed read data strobe and flip flop 850 is clocked by the inverted delayed read data strobe. Similarly, flip flops 840 and 860 share a common enable input, but flip flop 840 is clocked by the delayed read data strobe and flip flop 860 is clocked by the inverted delayed read data strobe. By toggling the enable input every clock cycle, flip flops 830 and 850 capture read data during alternating clock cycles from flip flops 840 and 860. In a preferred embodiment, the enable inputs are generated by the memory controller and are synchronous with the read data strobe's clocking domain of the DDR memory since it needs to toggle based on the read data strobe.

The data registered in flip flops 830 and 840 is output to MUX 810. MUX 810 selects which data to output to the flip flop 880. In a preferred embodiment, the select line for MUX 810 is generated by the memory controller and transitions based on the timing of the system clock. Similarly, the data registered in flip flops 850 and 860 is output to MUX 820. Again, MUX 820 selects which data to output to flip flop 890 based on a select input received from the memory controller.

The goal of read data capture cell 800 is to capture the read data from the DDR memory and transfer the read data into the clocking domain of the ASIC. Due to the variations in the flight time caused by changes in temperature and/or voltage and uncertainties built into the DDR memory and the distance between the DDR memory and the ASIC, the arrival time of the read data and read data strobe can vary in relation to the system clock of the ASIC. The embodiment of read data capture cell 800 described herein assumes that the variation introduced into the flight time is one clock cycle or less. However, as described herein the embodiment described can be scaled to handle larger potential variations in the flight time.

Figure 9B:
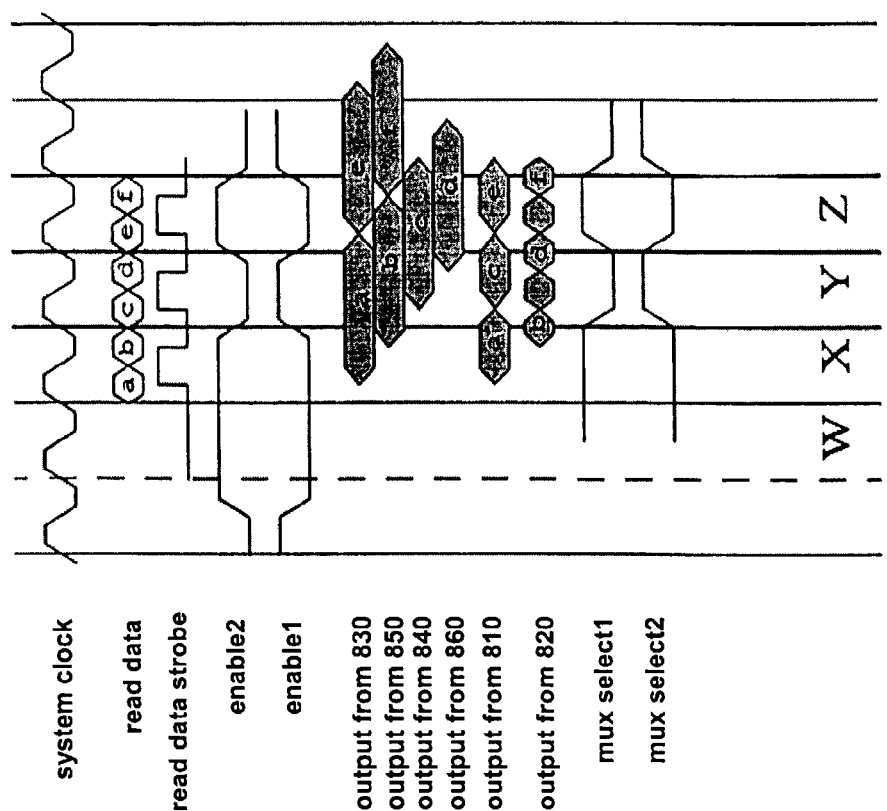

Read data capture cell 800 can be better understood when described with reference to FIGS. 9A–B. FIG. 9A is a timing diagram illustrating the earliest arrival of the read data and read data strobe. In this example, the read data strobe and read data experience no variation in the flight time (i.e. no additional delay). In contrast, FIG. 9B is a timing diagram illustrating the latest arrival time of the read data and read data strobe. Note that in this example, the difference between the arrival time in FIG. 9A and FIG. 9B is one clock cycle of variation. As described above, this is the maximum variation that can be handled by the embodiment of read data capture cell 800 described above.

Suppose, in one embodiment, that read data (a) may arrive at the earliest during clock cycle W of the system clock, as illustrated in FIG. A. Allowing for one clock cycle of variation means that the read data (a) can actually arrive at any time during clock cycle W of the system clock. As a result, read data (a) and (b) may not be available to register into flip flops 880 and 890 when the system clock transitions between clock cycles W and Y. Thus, even though it is possible for read data (a) and (b) to arrive during clock cycle W (FIG. 9A), the data is held until transition of the system clock between clock cycles X and Y to account for the possible one clock cycle of variation in the flight time that may occur (FIG. 9B). For this reason, the embodiment of read data capture cell 800 illustrated in FIG. 8 uses two sets of flip flops to capture read data on alternating clock cycles. For example, one set of flip flops can hold read data (a) and (b) until they can be clocked into flip flops 880 and 890 between clock cycles X and Y while the second set can receive read data (c) and (d) (which might arrive in clock cycle X or Y depending on the variation in the flight time) and hold the data until they can be clocked into flip flops 880 and 890 between clock cycles Y and Z. Once read data (a) and (b) are registered in flip flops 880 and 890, the flip flops holding this data can be used to capture the next set of read data, (e) and (f) in this example. This process continues until all of the read data has been captured and transferred to the clocking domain of the ASIC through flip flops 880 and 890.

Although this embodiment of the invention assumes that the variation in the flight time is one clock cycle or less, one skilled in the art will recognize that the invention can be scaled to handle greater variations in the flight time. For example, if the possible variation in the flight time is two clock cycles, the embodiment described can be scaled to reliably capture the read data by adding an additional set of flips flops and enable inputs. In such an embodiment, the flips flops would capture read data every third cycle, rather than every other clock cycle thus creating a three clock cycle window in which the read data can be captured and transferred to the clocking domain of the ASIC through flip flops 880 and 890.

While the invention has been described with reference to preferred embodiments, it is not intended to be limited to those embodiments. It will be appreciated by those of ordinary skilled in the art that many modifications can be made to the structure and form of the described embodiments without departing from the spirit and scope of this invention.

What is claimed is:

1. A method for capturing read data received from a memory that sends data on both a positive and a negative edge of a read data strobe, comprising;
    receiving read data from the memory;
    receiving a read data strobe;
    capturing the read data in a first edge triggered capture device having an enable input when the read data strobe transitions from low to high and the enable input is enabled;
    capturing the read data in a second edge triggered capture device having an enable input when the read data strobe transitions from high to low and the enable input is enabled;
    capturing the read data in a third edge triggered capture device having an enable input when the read data strobe transitions from low to high and the enable input is enabled; and
    capturing the read data in a fourth edge triggered capture device having an enable input when the read data strobe transitions from high to low and the enable input is enabled;
    wherein the first and second edge triggered capture devices are enabled during a first clock cycle of the read data strobe and the third and fourth edge triggered devices are enabled during a second clock cycle of the read data strobe.

2. The method of claim 1, wherein the first and third edge triggered capture devices are clocked by the read data strobe.

3. The method of claim 1 wherein the second and fourth edge triggered capture devices are clocked by an inverted read data strobe.

4. The method of claim 1, wherein the variation in a flight time of the read data from memory to the edge triggered device is one clock cycle or less.

5. The method of claim 1, wherein the memory is a double data rate (DDR) memory.

6. Circuitry for capturing read data received from a memory that sends data on both a positive and a negative edge of a read data strobe, comprising;
    an input for receiving a read data strobe;
    an input for receiving read data;
    a first edge triggered capture device having a clock input and an enable input, the first edge triggered capture device for capturing data on a positive edge of the read data strobe;
    a second edge triggered capture device having a clock input and an enable input, the second edge triggered capture device for capturing data on a negative edge of the read data strobe;
    a third edge triggered capture device having a clock input and an enable input, the third edge triggered capture device for capturing data on a positive edge of the read data strobe;
    a fourth edge triggered capture device having a clock input and an enable input, the fourth edge triggered capture device for capturing data on a negative edge of the read data strobe;
    wherein the first and second edge triggered capture devices are enabled to capture data during a first clock cycle of the read data strobe and the third and fourth edge triggered capture devices are enabled to capture data during a second clock cycle of the read data strobe.

7. The circuitry of claim 6, wherein the variation in a flight time of the read data from the memory to the edge triggered edge device is one clock cycle or less.

8. The method of claim 6, wherein the first and third edge triggered capture devices are clocked by the read data strobe.

9. The method of claim 6 wherein the second and fourth edge triggered capture devices are clocked by an inverted read data strobe.

10. The circuitry of claim 6, wherein the memory is a double data rate (DDR) memory.

11. An apparatus for sending write data to a memory that writes data on both a positive and negative edge of a clock signal, comprising;
    a first edge triggered capture device for receiving a bit of a first data word and a write clock signal, the first edge triggered capture device registering the bit of the first data word when the write clock signal transitions from low to high;
    a second edge triggered capture device for receiving a bit of a second data word and the write clock signal, the second edge triggered capture device registering the bit of the second data word when the write clock signal transitions from low to high; and
    a multiplexer for:
        receiving the bit of the first word and the bit of the second word from the first and second edge triggered capture devices, respectively, as the inputs to the multiplexer;
        receiving the write clock signal as the select input of the multiplexer; and
        outputting the bit of the first word when the write clock signal is high and the bit of the second word when the write clock is low.

12. The apparatus of claim 11, wherein the memory is a double data rate (DDR) memory.

13. An apparatus for sending a write data mask to a memory that writes data on both a positive and a negative edge of a clock signal, comprising;
    a first edge triggered capture device for receiving a write clock and a first data mask bit corresponding to a byte of data sent to the memory during the positive edge of the clock signal, wherein the first data mask bit is registered in the first edge triggered capture device when the write clock transitions from low to high;

a second edge triggered capture device for receiving a write clock and a second data mask bit corresponding to a byte of data sent to the memory during the negative edge of the clock signal, wherein the second data mask bit is registered in the second edge triggered capture device when the write clock transitions from low to high;

a multiplexer for:
  receiving the first data mask bit and the second data mask bit from the first and second edge triggered capture devices, respectively as the inputs to the multiplexer;
  receiving the write clock signal as the select of the multiplexer;
  outputting the first data mask bit to the memory when the write clock signal is high and outputting the second data mask bit to the memory when the write clock is low.

14. A method for sending a data mask during a write operation to a memory that reads and writes data on both a positive and a negative edge of a clock signal, comprising:
  receiving a first data mask bit at a first edge triggered capture device;
  receiving a second data mask bit at a second edge triggered capture device;
  receiving a write clock signal at the first and second edge triggered capture devices;
  registering the first data mask bit in the first edge triggered capture device when the write clock signal transitions from low to high;
  registering the second data mask bit in the second edge triggered capture device when the write clock signal transitions from low to high;
  receiving the first data mask bit from the first edge triggered capture device at one input of a multiplexer
  receiving the second data mask bit from the second edge triggered capture device at a second input of the multiplexer;
  receiving the write clock signal as the select input of the multiplexer;
  outputting the first data mask bit from the multiplexer to the memory when the write clock signal is high;
  outputting the second data mask bit from the multiplexor to the memory when the write clock signal is low.

15. A method for sending a write data strobe to a memory that writes data on both a positive and a negative edge of a clock signal, comprising:
  receiving the write data strobe;
  receiving a write enable control signal;
  receiving a write data strobe enable control signal;
  outputting a preamble prior to the write data strobe, the preamble determined from the write enable control signal and the write data strobe enable control signal; and
  outputting the write data strobe.

* * * * *